(12) United States Patent
Edelberg

(10) Patent No.: US 8,475,673 B2
(45) Date of Patent: Jul. 2, 2013

(54) METHOD AND APPARATUS FOR HIGH ASPECT RATIO DIELECTRIC ETCH

(75) Inventor: Erik A. Edelberg, San Ramon, CA (US)

(73) Assignee: Lam Research Company, Fremont, CA (US)

(*) Notice: Subject to any disclaimer, the term of this patent is extended or adjusted under 35 U.S.C. 154(b) by 629 days.

(21) Appl. No.: 12/429,940

(22) Filed: Apr. 24, 2009

(65) Prior Publication Data
US 2010/0273332 A1    Oct. 28, 2010

(51) Int. Cl.
*H01L 21/3065*    (2006.01)

(52) U.S. Cl.
USPC ... 216/67; 438/710; 156/345.24; 156/345.28; 257/E21.218

(58) Field of Classification Search
None
See application file for complete search history.

(56) References Cited

U.S. PATENT DOCUMENTS

| | | | | |
|---|---|---|---|---|
| 5,779,807 | A * | 7/1998 | Dornfest et al. | 134/1.2 |
| 6,020,592 | A * | 2/2000 | Liebert et al. | 250/492.21 |
| 6,214,160 | B1 * | 4/2001 | Dornfest et al. | 156/345.28 |
| 6,506,674 | B2 * | 1/2003 | Ikeda et al. | 438/637 |
| 6,902,683 | B1 | 6/2005 | Kaji et al. | |
| 7,083,903 | B2 * | 8/2006 | Edelberg et al. | 430/329 |
| 7,415,940 | B2 * | 8/2008 | Koshimizu et al. | 118/723 E |
| 7,452,823 | B2 * | 11/2008 | Sato | 438/706 |
| 7,547,636 | B2 * | 6/2009 | Chi et al. | 438/714 |
| 7,682,986 | B2 * | 3/2010 | Chi et al. | 438/723 |
| 7,977,390 | B2 * | 7/2011 | Ji et al. | 516/67 |
| 2002/0039843 | A1 * | 4/2002 | Ikeda et al. | 438/738 |
| 2003/0164142 | A1 * | 9/2003 | Koshimizu | 118/409 |
| 2003/0209324 | A1 * | 11/2003 | Fink | 156/345.48 |
| 2004/0149221 | A1 * | 8/2004 | Koshimizu et al. | 118/723 R |
| 2004/0256357 | A1 * | 12/2004 | Edelberg et al. | 216/67 |
| 2005/0236111 | A1 * | 10/2005 | Higashiura | 156/345.47 |
| 2006/0004289 | A1 | 1/2006 | Tian et al. | |
| 2006/0005856 | A1 * | 1/2006 | Sun et al. | 134/1.1 |
| 2006/0019477 | A1 * | 1/2006 | Hanawa et al. | 438/514 |
| 2006/0051965 | A1 * | 3/2006 | Edelberg et al. | 438/706 |
| 2006/0201911 | A1 * | 9/2006 | Edelberg et al. | 216/67 |
| 2007/0026677 | A1 * | 2/2007 | Ji et al. | 438/689 |
| 2007/0113981 | A1 * | 5/2007 | Brcka | 156/345.48 |
| 2008/0119055 | A1 | 5/2008 | Ji et al. | |
| 2008/0182422 | A1 * | 7/2008 | Edelberg et al. | 438/725 |
| 2008/0188081 | A1 * | 8/2008 | Chi et al. | 438/700 |
| 2008/0188082 | A1 * | 8/2008 | Chi et al. | 438/700 |
| 2009/0000946 | A1 * | 1/2009 | Singh et al. | 204/298.01 |
| 2009/0068767 | A1 * | 3/2009 | Sirard et al. | 438/8 |
| 2009/0084987 | A1 * | 4/2009 | Godet et al. | 250/492.3 |
| 2009/0179161 | A1 * | 7/2009 | Ward et al. | 250/492.21 |
| 2009/0275207 | A1 * | 11/2009 | Honda et al. | 438/729 |
| 2010/0132889 | A1 * | 6/2010 | Chi et al. | 156/345.26 |
| 2010/0159120 | A1 * | 6/2010 | Dzengeleski et al. | 427/8 |

(Continued)

*Primary Examiner* — Allan Olsen
(74) *Attorney, Agent, or Firm* — Beyer Law Group LLP

(57) ABSTRACT

An apparatus for etching high aspect ratio features is provided. A plasma processing chamber is provided, comprising a chamber wall forming a plasma processing chamber enclosure, a lower electrode, an upper electrode, a gas inlet, and a gas outlet. A high frequency radio frequency (RF) power source is electrically connected to at least one of the upper electrode or lower electrode. A bias power system is electrically connected to both the upper electrode and the lower electrode, wherein the bias power system is able to provide a bias to the upper and lower electrodes with a magnitude of at least 500 volts, and wherein the bias to the lower electrode is pulsed to intermittently. A gas source is in fluid connection with the gas inlet. A controller is controllably connected to the gas source, the high frequency RF power source, and the bias power system.

13 Claims, 6 Drawing Sheets

U.S. PATENT DOCUMENTS

| | | | |
|---|---|---|---|
| 2010/0190350 A1* | 7/2010 | Yatsuda et al. | 438/710 |
| 2010/0210114 A1* | 8/2010 | Ooya | 438/729 |
| 2010/0273332 A1* | 10/2010 | Edelberg | 438/710 |
| 2011/0214813 A1* | 9/2011 | Koshiishi et al. | 156/345.33 |
| 2012/0000421 A1* | 1/2012 | Miller et al. | 118/712 |
| 2012/0021136 A1* | 1/2012 | Dzengeleski et al. | 427/523 |
| 2012/0141693 A1* | 6/2012 | Ward et al. | 427/585 |

* cited by examiner

METHOD AND APPARATUS FOR HIGH ASPECT RATIO DIELECTRIC ETCH

BACKGROUND OF THE INVENTION

1. Field of the Invention

The invention relates to a method of obtaining a structure on a semiconductor wafer by etching through a dielectric layer defined by a mask using a plasma.

2. Description of the related art

Plasma-etching processes are commonly used in the fabrication of semiconductor devices. Generally, photoresist material forms feature patterns on the surface of the wafer to be etched, and features are then etched into the wafer by exposing the wafer to a particular type of etching gas. One of the challenges faced in plasma etching is the ever-increasing aspect ratio needed to meet design requirements, especially for ultra-high density structures. When etching features on semiconductor wafers, the aspect ratio of an etched feature is defined as the ratio between the feature's depth (d) and the feature's width (w) or diameter. As more features are packed on a single piece of wafer to create higher density structures, the width (w) or diameter of each individual feature necessarily decreases, while the depth of the features remains unchanged or increases. Thus, the aspect ratio of each individual feature increases as the device feature shrinks.

A difficulty during ultra-high aspect ratio (UHAR) etching is twisting and or distortion, which is generally defined as deviations of location, orientation, shape, and size near the bottom of a feature from the pattern defined by the mask on the top of the feature. When the aspect ratio of a feature reaches a certain threshold, while the feature's width is very small, twisting occurs, particularly near the bottom of the feature. In addition, such UHAR etches are subjected to aspect ratio dependent etching (ARDE). These difficulties are further disclosed in U.S. patent application Ser. No. 11/562,335, entitled "REDUCING TWISTING IN ULTRA-HIGH ASPECT RATIO DIELECTRIC ETCH," to Ji et al., filed Nov. 21, 2006, which is incorporated by reference for all purposes.

SUMMARY OF THE INVENTION

To achieve the foregoing and in accordance with the purpose of the present invention, an apparatus for etching high aspect ratio features in a dielectric layer is provided. A plasma processing chamber is provided, comprising a chamber wall forming a plasma processing chamber enclosure, a lower electrode for providing power to the plasma processing chamber enclosure over which the substrate is supported, an upper electrode for providing power to the plasma processing chamber enclosure spaced apart above the lower electrode, a gas inlet for providing gas into the plasma processing chamber enclosure, and a gas outlet for exhausting gas from the plasma processing chamber enclosure. A high frequency radio frequency (RF) power source is electrically connected to at least one of the upper electrode or lower electrode. A bias power system is electrically connected to both the upper electrode and the lower electrode, wherein the bias power system is able to provide a bias to the upper and lower electrodes with a magnitude of at least 500 volts, and wherein the bias to the upper electrode creates secondary electrons and wherein the bias to the lower electrode is pulsed to intermittently collapse a generated plasma sheath. A gas source is in fluid connection with the gas inlet, comprising a dielectric etching gas source. A controller is controllably connected to the gas source, the high frequency RF power source, and the bias power system.

In another manifestation of the invention an apparatus for etching high aspect ratio features in a dielectric layer is provided. A plasma processing chamber is provided, comprising: a chamber wall forming a plasma processing chamber enclosure, a lower electrode for providing power to the plasma processing chamber enclosure over which the substrate is supported, an upper electrode for providing power to the plasma processing chamber enclosure spaced apart above the lower electrode, a gas inlet for providing gas into the plasma processing chamber enclosure, and a gas outlet for exhausting gas from the plasma processing chamber enclosure. A high frequency radio frequency (RF) power source is electrically connected to at least one of the upper electrode or lower electrode. A bias power system is electrically connected to both the upper electrode and the lower electrode and comprises a low frequency RF source and a switch electrically connected between the low frequency RF source and the upper electrode and lower electrode for alternatingly switching between the upper electrode and lower electrode. A gas source is in fluid connection with the gas inlet, comprising a dielectric etching gas source. A controller is controllably connected to the gas source, the high frequency RF power source, and the bias power system.

In another manifestation of the invention, a method for etching high aspect ratio features in a dielectric layer over a substrate in a plasma processing chamber is provided. The substrate is placed in the plasma processing chamber, with an upper electrode and a lower electrode, wherein the substrate is placed over the lower electrode, and wherein the upper electrode is space apart above the lower electrode and the substrate. An etching gas is provided into the plasma processing chamber. A plasma is formed in the plasma processing chamber, between the upper electrode and the lower electrode. A bias is provided to the upper electrode of at least 500 volts to form secondary electrons. A pulsed bias of at least 500 volts is provided to the lower electrode for etching the dielectric layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
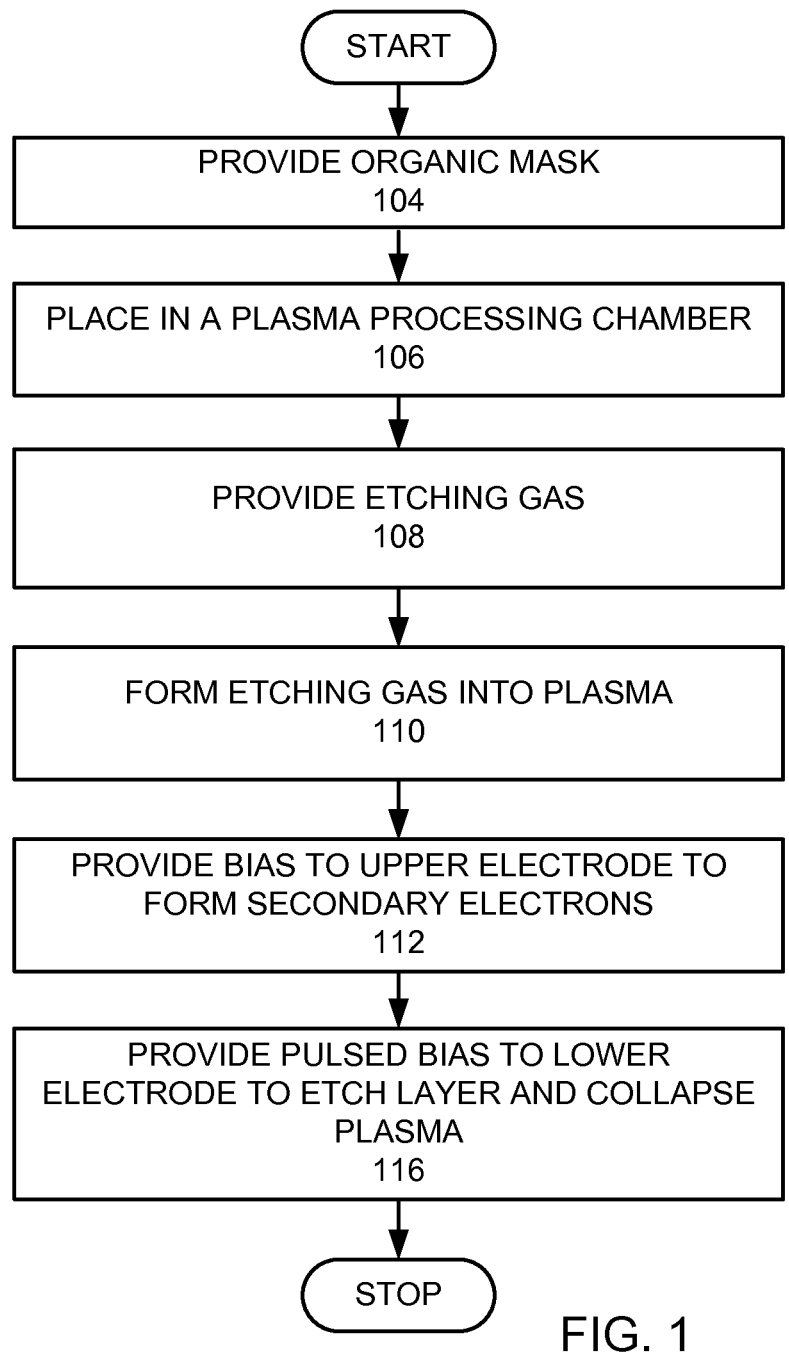
FIG. 1 is a flow chart of an inventive etch process.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Without wishing to be bound by the following, it is tentatively theorized that twisting is a result of asymmetric etching in ultra-high aspect ratio (UHAR) features. There are several mechanisms contributing to asymmetric etching as the feature aspect ratio increases. The main mechanism is asymmetric deflection of incident ion trajectories near the bottom of the UHAR features. Anisotropic reactive ion etch (RIE) is a result of complex reactions between the exposed dielectric surfaces and the reactive neutral radicals and ions from the plasma. The flux of the neutral species to the bottom of a feature is dominated by Knudsen diffusion and the sticking coefficient of the species to the feature sidewalls. The fluorocarbon radicals commonly used in dielectric etch typically have high sticking coefficient, and hence their flux to the bottom of a feature strongly depends on the aspect ratio (AR) of the feature.

As a feature's AR increases (typically greater than 10-to-1), neutral fluxes reaching the bottom of the feature become greatly diminished and can no longer drive the etch reactions. At high and especially ultra-high aspect ratio (typically greater than 10-to-1 and especially greater than 15-to-1), etch reactions are driven by ion fluxes to the bottom of the feature. Ion fluxes to the bottom of the feature is dominated by plasma ion density, ion energy distribution, and the feature's bottom potential due to differential charging. Ions are first accelerated by the electrical field across the plasma sheath. The sheath electrical field is determined by the bulk plasma potential and the wafer surface potential, which is driven by the applied Radio Frequency (RF) fields. Although the invention is able to provide ultra-high aspect ratio features, the invention is also able to provide high aspect ratio features with an AR greater than 10-to-1 with reduced distortion, twisting, and ARDE.

In advanced plasma etchers, multiple radio frequencies are used to drive the plasma. For example, 27 mega Hertz (MHz) and/or 60 MHz RF power, also known as "source high frequency HF radio frequency RF power," is used to maintain plasma density, while 2 MHz RF power, also known as "low frequency LF or bias RF power," is used to drive the plasma sheath potential. At the wafer's top surface, charge balance is achieved by the momentary electron flux when the plasma sheath collapses during an RF cycle. However, electron flows are not directional, and thus cannot reach the bottom of the UHAR features efficiently. As a result, the bottom of the UHAR features accumulates residual positive charges over an RF cycle. This is called differential charging.

Differential charging causes the increase of the potential at the bottom of the UHAR features, which retards or deflects the incident ions towards the bottom of the UHAR features. Differential charging also causes the slowing down of etch rate as AR increases, a phenomenon well known as aspect ratio dependent etching (ARDE). In other words, when incident energy is below the differential charging potential, ions are deflected. On the other hand, when incident energy is above the differential charging potential, ions are slowed down, but not deflected, causing lower etch rate at ultra-high aspect ratio. If differential charging is asymmetrical due to some random preferential build up of polymer residues or charges at ultra-high aspect ratio, ion deflection becomes asymmetrical. Asymmetrical ion deflection causes asymmetrical etching in some random direction, so the etch front becomes asymmetrical. This is a feed forward mechanism: The asymmetrical etch front enhances asymmetrical differential charging, which further propagates the asymmetrical etch front, and so on. As a result, twisting occurs at UHAR etch.

Figure 2A:
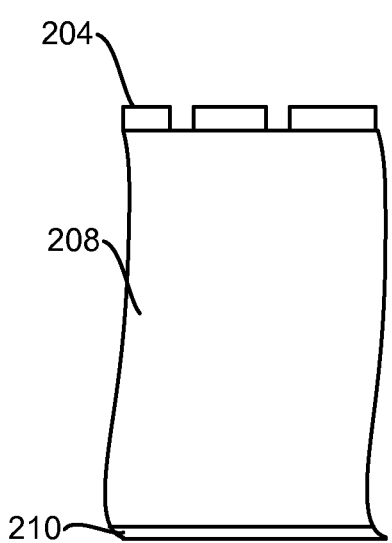
FIGS. 2A-C are schematic views of the formation of features using the inventive process and apparatus.

FIG. 1 is a high level flow chart of an embodiment of the invention. In this embodiment, a patterned organic mask is formed over a dielectric layer (step 104). FIG. 2A is a schematic cross-sectional view of a substrate 210, over which a dielectric layer 208 is disposed, over which a patterned mask 204 has been form. One or more intermediate layers may be disposed between the substrate (wafer) 210 and the dielectric layer 208. One or more intermediate layers, such as an anti-reflective coating, may be disposed between the dielectric layer 208 and the patterned mask 204.

Figure 3:
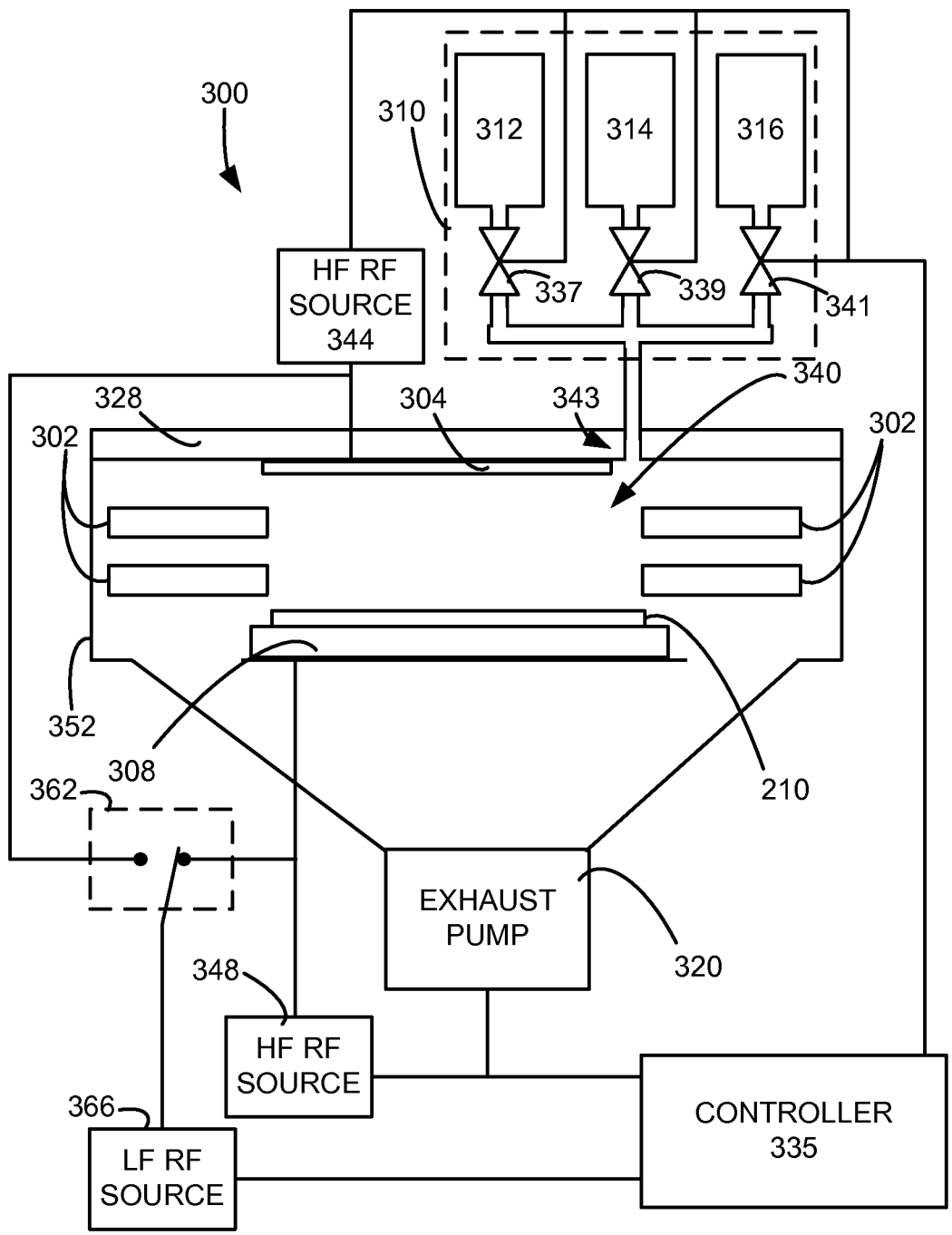
FIG. 3 is a schematic view of an apparatus that may be used in practicing the invention.

The substrate 210 is placed in a plasma processing chamber (step 106). FIG. 3 is a schematic view of a plasma processing chamber 300 that may be used in the preferred embodiment of the invention. In this embodiment, the plasma processing chamber 300 comprises confinement rings 302, an upper electrode 304, a lower electrode 308, a gas source 310, and an exhaust pump 320. The upper electrode 304 and lower electrode 308 are parallel plate electrodes. The gas source 310 may comprise a first gas source 312, a second gas source 314, and a third gas source 316. Within the plasma processing chamber 300, the substrate 210 is positioned upon the lower electrode 308. The lower electrode 308 incorporates a suitable substrate chucking mechanism (e.g., electrostatic, mechanical clamping, or the like) for holding the substrate 210 over the lower electrode 308. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by gas source 310 through a gas inlet 343 and is exhausted from the confined plasma volume 40 through the confinement rings 302 and an exhaust port by the exhaust pump 320. The exhaust pump 320 forms a gas outlet for the plasma processing chamber. A first HF RF source 344 is electrically connected to the upper electrode 304. A second HF RF source 348 is electrically connected to the lower electrode 308. In this application, a high frequency (HF) RF is defined as having a frequency over 10 MHz. Chamber walls 352 define a plasma enclosure in which the confinement rings 302, the upper electrode 304, and the lower electrode 308 are disposed. Both the first HF RF source 344 and the second HF RF source 348 may comprise a 60 MHz power source and a 27 MHz power source. Different combinations of connecting HF RF power to the electrode are possible. A controller 335 is controllably connected to the first HF RF source 344, the second HF RF source 348, the exhaust pump 320, a first control valve 337 connected to the first gas source 312, a second control valve 339 connected to the second gas source 314, and a third control valve 341 connected to the third gas source 316. The gas inlet 343 provides gas from the gas sources 312, 314, 316 into the plasma processing enclosure. A showerhead may be connected to the gas inlet 343. The gas inlet 343 may be a single inlet for each gas source or a different inlet for each gas source or a plurality of inlets for each gas source or other possible combinations. A modified Flex-45 dielectric etcher made by LAM Research Corporation™ of Fremont, Calif. may be used in a preferred embodiment of the invention. One of the modifications is that the first and second HF RF sources 344 and 348 do not provide a low frequency RF. Instead, a separate LF RF source 366 is provided and connected to a switch 362, which is connected to the upper and lower electrodes 304, 308. The switch 362 and LF RF source 366 are controllably connected to the controller 335.

Figure 4A:
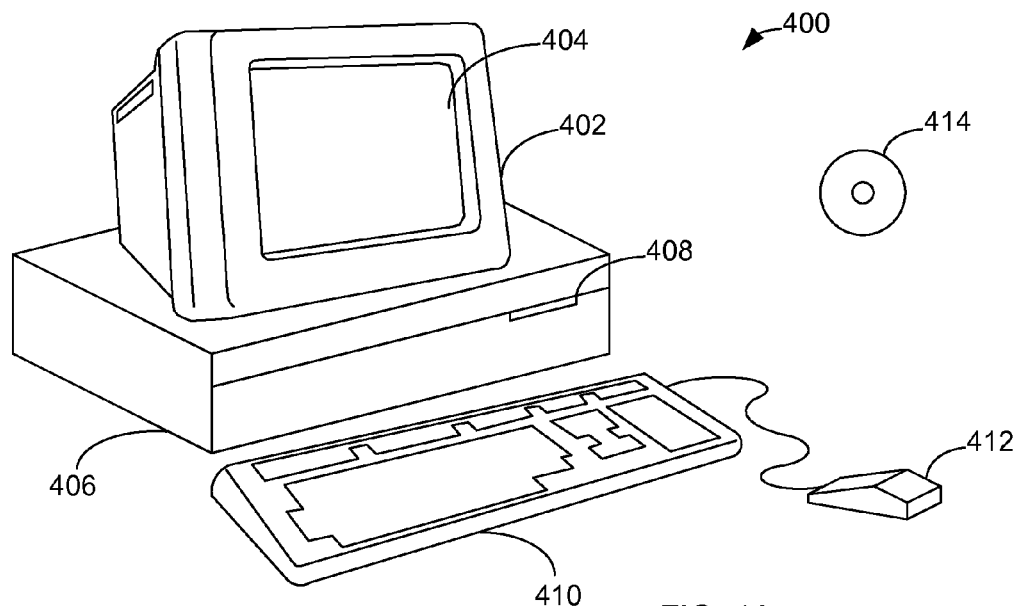
FIGS. 4A-B are schematic views of a computer system that may be used in practicing the invention.
Figure 4B:
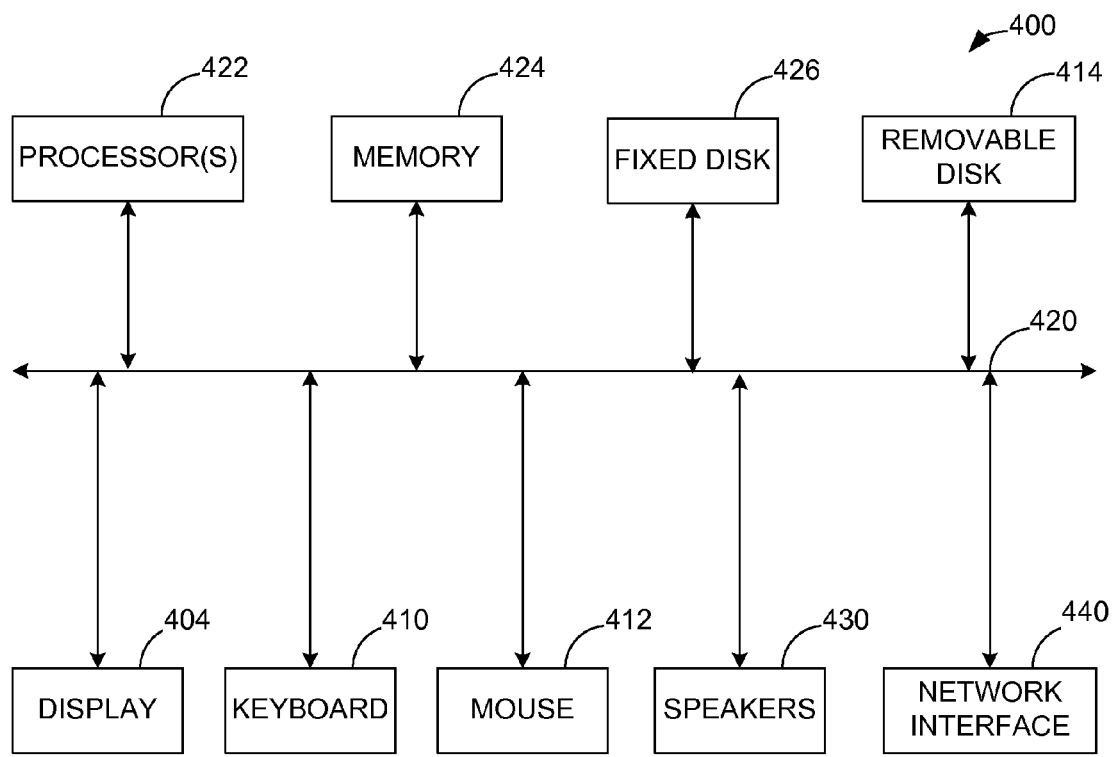

FIGS. 4A and 4B illustrate a computer system 400, which is suitable for using as the controller 335. FIG. 4A shows one possible physical form of a computer system that may be used for the controller 335. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 may be also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

An etching gas is provided from the gas source 310 through the gas inlet 343 into the plasma processing chamber 300 (step 108). The etching gas is formed into a plasma (step 110). In a preferred embodiment, at least one of the first or second HF RF sources 344, 348 provide HF RF power to at least one of the upper or lower electrodes 304, 308, which forms the etching gas into a plasma.

A bias that provides a sheath voltage of at least 500 volts is applied to the upper electrode 304 to form secondary electrons (step 112). The high bias of at least 500 volts causes ions from the plasma to collide with the upper electrode 304 generating secondary electrons which are accelerated away from the upper electrode 304 by the bias.

Figure 2B:
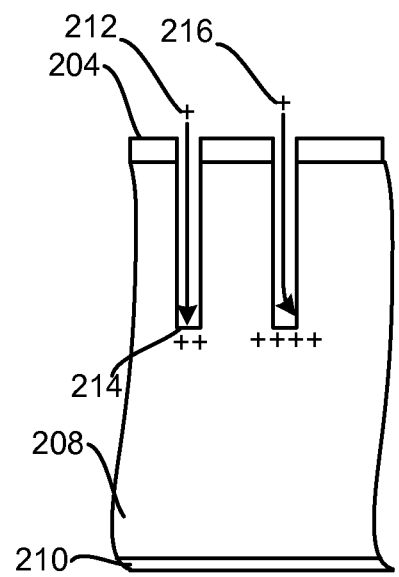
Figure 5A:
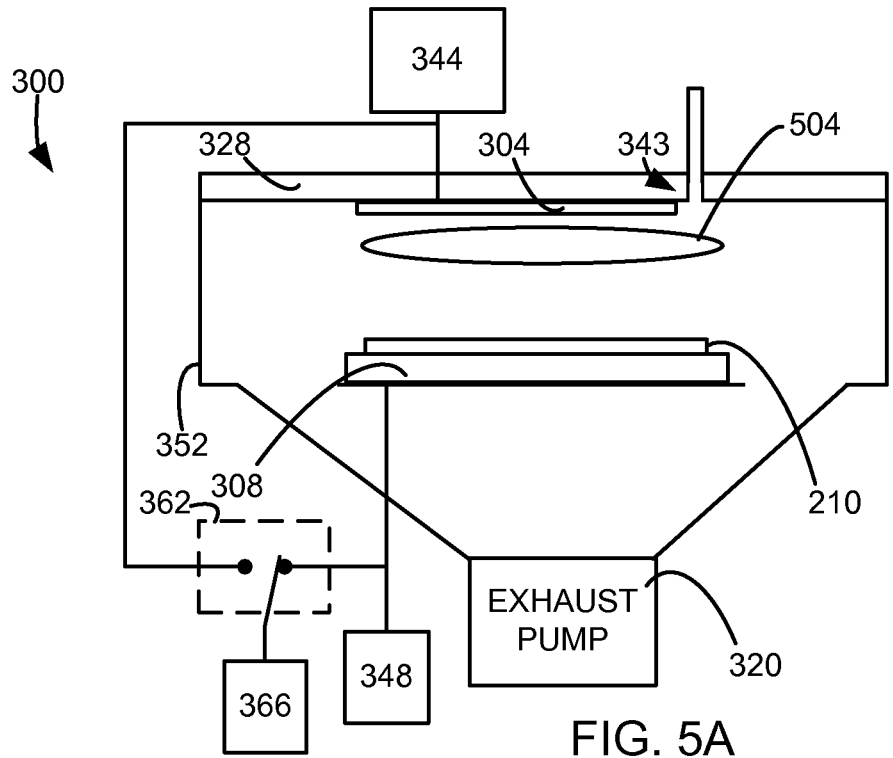
FIGS. 5A-B are schematic views of a system in different states during the practice of the invention.

A pulsed bias that provides a pulsed voltage amplitude with a magnitude of at least 500 volts is provided to the lower electrode, where the bias causes etching of the etch layer and the removal of the bias causes the plasma sheath to collapse (step 116). FIG. 5A is a simplified view of a plasma processing chamber 300 when a bias voltage of at least 500 volts is applied to the lower electrode 308. Many of the components of the plasma processing chamber 300 are not illustrated, to allow a clearer understanding of the invention. In this example, the switch 362 is set so that the LF RF source provides a LF RF bias voltage to the lower electrode 308, but not to the upper electrode 304. The bias to the lower electrode 308, places a negative bias voltage on the lower electrode 308. The negative bias voltage results in a large sheath above the lower electrode causing the bulk plasma to be positioned closer to the upper electrode. This negative bias voltage accelerates positive ions to the lower electrode 308. The accelerated positive ions etch the dielectric layer. The negative bias voltage on the lower electrode 308 also repels electrons in the plasma sheath 504 away from the lower electrode 308. FIG. 2B is a schematic cross-sectional view of the substrate 210, when the bias of at least 500 volts is applied to the lower electrode 308. Positive ions are accelerated by the negative bias on the lower electrode 308 into partially etched vias of the dielectric layer, causing the etching of the vias. Ion 212 is an example of such an ion being used to etch the bottom of the vias 214. The positively charged ions striking and etching the bottom of the vias 214 causes a positive charge to build up at the bottom of the vias, which is indicated by the plus signs at the bottom of the vias 214 since the layer being etched is dielectric. Ion 216 represents an ion that is deflected by the positive charge at the bottom of a via. The positive charge provides a force, which causes a deflection of the ion 216 into the wall of the via. The deflected ion 216 causes the wall of the via to be etched, which contributes to twisting and distortion of the via.

Figure 2C:
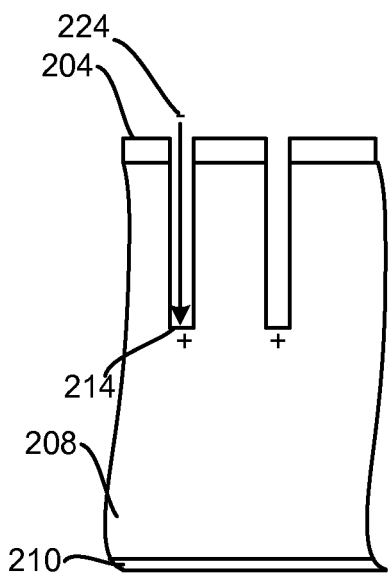
Figure 5B:
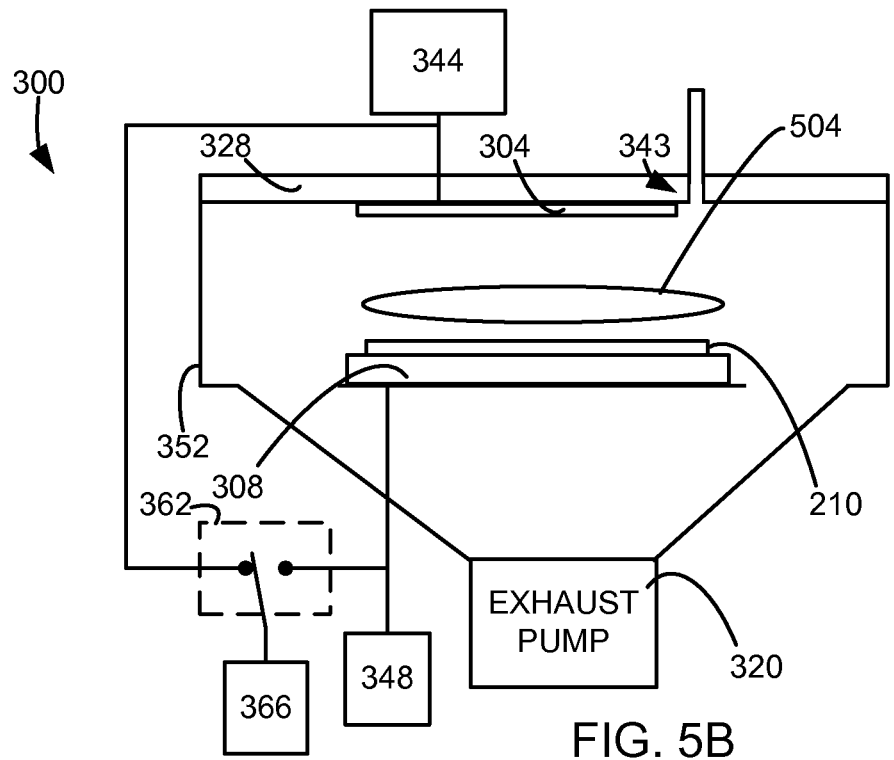

FIG. 5B is a simplified view of a plasma processing chamber 300 when a bias voltage of at least 500 volts is applied to the upper electrode 304. In this example, the switch 362 is set so that the LF RF source provides a LF RF bias voltage to the upper electrode 304, but not to the lower electrode 308. The bias to the upper electrode 304, places a negative bias voltage on the upper electrode 304, which accelerates positive ions to the upper electrode 304. The accelerated positive ions strike the upper electrode 304, or a layer near the upper electrode 304, to produce secondary electrons. The negative bias voltage on the upper electrode 304 also accelerates and repels the secondary electrons through the plasma sheath 504. The negative bias voltage increases the sheath thickness at the upper electrode 304, causing the bulk plasma to be positioned closer to the lower electrode 308. FIG. 2C is a schematic cross-sectional view of the substrate 210, when the bias of at least 500 volts is applied to the upper electrode 304. Positive ions are accelerated by the negative bias on the upper electrode 304 into the upper electrode 304, or an adjacent layer, causing the upper electrode 304 to generate secondary electrons, which are accelerated away from the upper electrode 304 to the dielectric layer 208. Secondary electron 224 is an example of such a secondary electron that is accelerated to the bottom of the vias 214. The positively charged bottom of the vias 214 accelerates the secondary electrons 224 to the bottom of the vias 214, which reduces the positive charge at the bottom of the vias 214. The preferred embodiment uses a bias of at least 500 volts in order to provide secondary electrons with enough energy and flux to pass through the plasma sheath and reach vias. Once the secondary electrons reach the vias or features, the positive charge at the bottom of the vias or features accelerates the secondary electrons to the bottom of the vias or features. In this embodiment, the HF RF sources are not alternated between the upper and lower electrodes.

When the positive charge at the bottoms of the vias is reduced, the switch 362 is able to return to the position as shown in FIG. 5A and the positive ions are able to be used to continue to etch with reduced deflection, thus reduced twisting, distortion, and aspect ratio dependent etching (ARDE). This switching process may be continued until the etch is completed.

Although in some embodiments the bias to the upper electrode is not pulsed or switched, since secondary electrons can be continuously created, in the above preferred embodiment, the alternation of the bias causes the upper electrode to only create secondary electrons, when the plasma sheath above the substrate is collapsed and the dielectric layer is not being etched. This reduces wear on the upper electrode, by not sputtering the upper electrode all the time, but instead when needed.

The use of a switch and a single LF RF source allows for requirement of minimal LF RF sources, which is preferable, although other embodiments may alternate biasing by having separate bias sources.

In this embodiment, although providing the etching gas may start before forming the gas into a plasma, at some time providing the etching gas, forming the etching gas into the plasma and providing the alternating bias occur at the same time, i.e. simultaneously.

Various Embodiments

Figure 6:
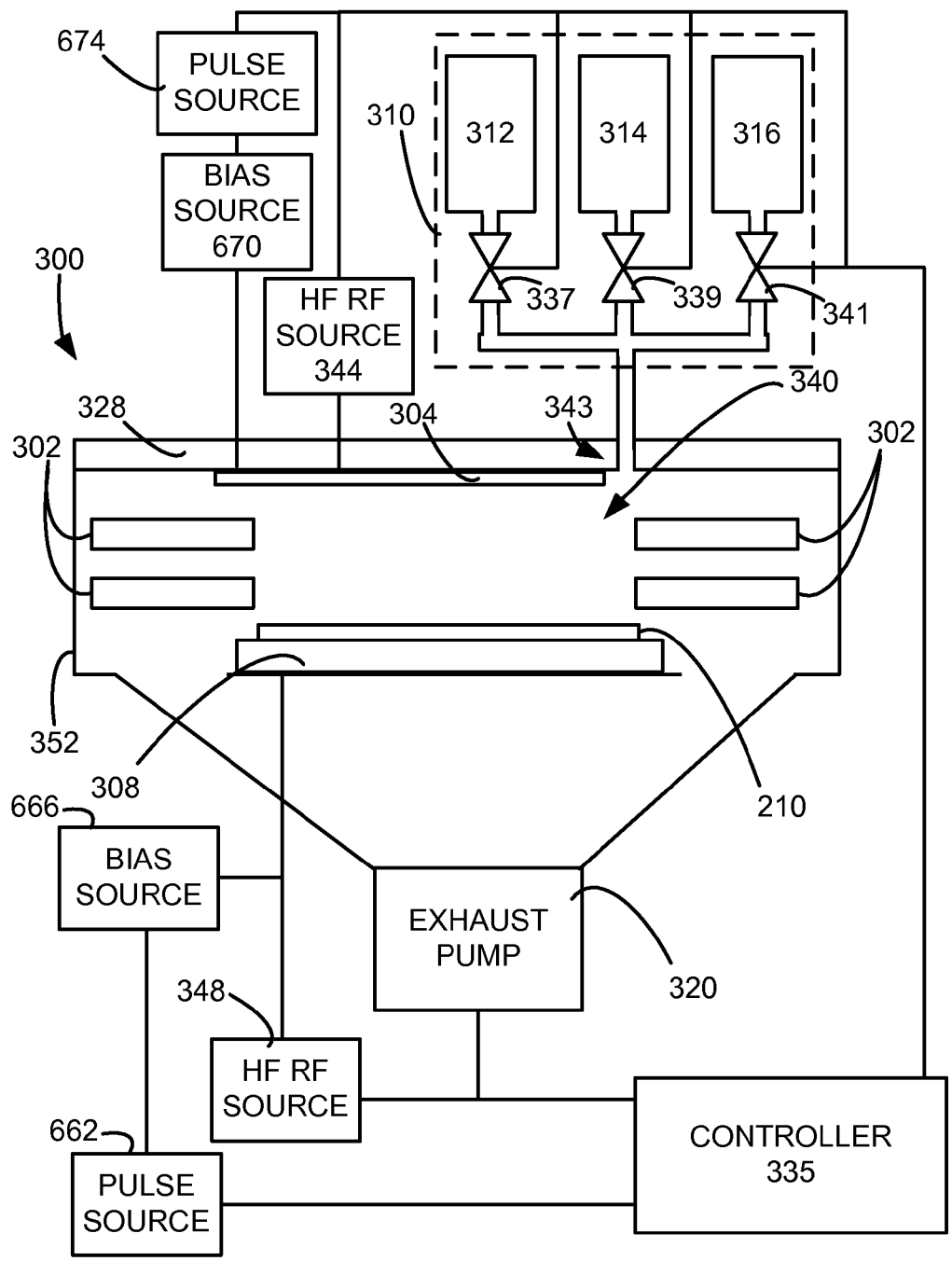
FIG. 6 is a schematic view of another apparatus that may be used in the practice of the invention.

In the above embodiment, the LF RF source 366, the switch 362 and the connections between the switch 362 form a bias power system electrically connected to both the upper electrode and the lower electrode, where the bias power system is able to provide a bias to the upper and lower electrodes of at least 500 volts, and where the bias to the upper electrode creates secondary electrons and where the bias to the lower electrode is pulsed to intermittently collapse a generated plasma sheath with the secondary electrons. Other embodiments of such a system may be provided. For example, FIG. 6 illustrates another embodiment of a plasma process chamber 300 with a bias power system with a first low frequency RF bias source 670 connected to the upper electrode 304 and a second low frequency RF bias source 666 connected to the lower electrode 308. A first pulse source 674 is connected to the first low frequency bias source 670 to pulse the signal from the first low frequency RF bias source 670. A second pulse source 662 is connected to the second low frequency bias source 674 to pulse the signal from the second low frequency RF bias source 666. In this embodiment the signal from the first LF RF bias source 670 is pulsed. Preferably, such pulsing creates an alternating bias between the upper and lower electrodes, however other pulse schemes may be used. In another embodiment, even though the biases are not switched, the pulsing of the top electrode bias has a frequency equal to the frequency of the pulsing of the lower electrode bias, and the biasings are not completely simultaneous.

It is preferable that at some time, providing the etching gas, forming the etching gas into a plasma, and pulsing the biases overlap in that they for some time occur together. In the alternative, the signal from the first LF RF is not pulsed. In another embodiment, one or more of the LF RF bias sources may be replaced with a DC bias of at least 500 volts. In this specification, a low frequency RF is an RF with a frequency of less than 10 MHz.

In another embodiment, a single LF RF source is connected both to the upper and lower electrode. A switch is connected between the LF RF source and the lower electrode to provide a pulsed bias to the lower electrode. In another embodiment, two switches are used where one switch is used between the LF RF source and the upper electrode and one switch is used between the LF RF source and the lower electrode. Preferably, the switches are timed so that at some time the upper electrode has a bias while the lower electrode does not have a bias. In another embodiment a single sophisticated switch may be used for the two switches.

Various configurations of the HF RF sources may be used in different embodiments. In one embodiment, a HF RF source is connected to the lower electrode, but not the upper electrode. In such a case, the upper electrode may have a low impedance to ground. In another embodiment, a HF RF is connected to the upper electrode but not the lower electrode.

Preferred embodiments of the invention provide an ultra-high aspect ratio via etch. Preferably, an ultra-high aspect ratio (UHAR) for a feature for this invention is defined as a depth-to-width ratio greater than 15-to-1. More preferably, an UHAR for a feature for this invention is defined as at least 20-to-1. In addition, preferably, the present invention applies to etching features in the dielectric layer with a width of no more than 300 nanometers (nm). More preferably, the present invention applies to etching features in the dielectric layer with a width of no more than 200 nm. Most preferably, the present invention applies to etching features in the dielectric layer with a width of no more than 150 nm.

Other embodiments may have an HF RF source that provides a 162 MHz signal to the upper electrode and another HF RF source providing a 13.56 MHz signal to the bottom electrode. Another embodiment may provide a HF RF source that provides 60 MHz signal to the upper electrode. Another embodiment may provide a HF RF source that provides 40 MHz signal to the bottom electrode and a LF RF source that provides 4 MHz signal to the lower electrode and a DC bias applied to the upper electrode.

EXAMPLES

In an example of the invention, the dielectric layer may be silicon oxide based, where the dielectric layer is mainly formed of silicon oxide, with smaller amounts of other types of substance mixed in. More preferably, the dielectric layer is a low-k dielectric, such as organosilicate glass. In another embodiment the dielectric layer is an organic dielectric layer.

In an example recipe of a silicon oxide based dielectric etch, the etch chamber pressure is 30 milli-Torr (mTorr). The etch gas comprises 150 standard cubic centimeters per minute (sccm) of argon (Ar), 4 sccm of $C_4F_6$, 18 sccm of $C_4F_8$, and 17 to 25 sccm of oxygen ($O_2$). The source HF RF power is at 2000 watts (W) with a frequency of 27 MHz. The LF RF power is 4000 W with a frequency of 2 MHz. The LF RF power is alternated between the upper and lower electrodes. The 2 Mhz power delivered to the upper and lower electrode may not be of the same magnitude and can be adjusted for optimal results.

Preferably the LF RF power is alternated at a switching frequency of 10 Hz to 100 kHz. If instead the bias power to the lower electrode is pulsed, preferably the bias power is pulsed at a frequency of 10 Hz to 100 kHz.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching high aspect ratio features in a dielectric layer over a substrate in a plasma processing chamber, comprising:
   placing the substrate in the plasma processing chamber, with an upper electrode and a lower electrode, wherein the substrate is placed over the lower electrode, and wherein the upper electrode is space apart above the lower electrode and the substrate;
   providing an etching gas into the plasma processing chamber;
   forming a plasma in the plasma processing chamber, between the upper electrode and the lower electrode;
   providing a bias to the upper electrode of at least 500 volts to provide secondary electrons with enough energy to pass through the plasma sheath to vias, wherein a positive charge at the bottom of the vias accelerates the secondary electrons to the bottom of the vias;
   providing a pulsed bias of at least 500 volts to the lower electrode for etching the dielectric layer; and
   wherein the forming a plasma in the plasma processing chamber, between the upper electrode and the lower electrode, comprises providing a high frequency RF with a frequency of over 10 MHz to at least one of the upper electrode or lower electrode.

2. The method, as recited in claim 1, wherein the providing bias to the upper electrode comprises pulsing the bias to the upper electrode, so that bias is alternated between the upper electrode and the lower electrode.

3. The method, as recited in claim 2, wherein the providing bias to the upper electrode, further comprise providing a low frequency RF power to the upper electrode, and wherein the providing bias to the lower electrode comprises providing a low frequency RF power to the lower electrode.

4. The method, as recited in claim 1, wherein the providing bias to the upper electrode and providing bias to the lower electrode, comprises switching a bias between the upper electrode and lower electrode.

5. The method, as recited in claim 1, wherein the providing the bias to the upper electrode accelerates ions into the upper electrode to generate the secondary electrons and accelerates the secondary electrons to bottoms of vias and wherein the providing a pulsed bias of at least 500 volts to the lower electrode is pulsed to collapse a generated plasma sheath.

6. The method, as recited in claim 5, wherein the providing bias to the upper electrode and providing bias to the lower electrode are alternately switched a plurality of times, comprising switching a bias between the upper electrode and the lower electrode a plurality of times.

7. The method, as recited in claim 6, wherein the providing bias to the lower electrode accelerates positive ions to bottoms of vias to provide etching of the vias, which creates a positive charge at bottoms of the vias, and wherein the secondary electrons reduce the positive charge at bottoms of the vias.

8. The method, as recited in claim 7, wherein the high aspect ratio features have aspect ratios of at least 20-to-1.

9. The method, as recited in claim 1, wherein the providing bias to the upper electrode and providing bias to the lower electrode are alternately switched a plurality of times, comprising switching a bias between the upper electrode and the lower electrode a plurality of times.

10. The method, as recited in claim 1, wherein the providing bias to the lower electrode accelerates positive ions to bottoms of vias to provide etching of the vias, which creates a positive charge at bottoms of the vias, and wherein the secondary electrons reduce the positive charge at bottoms of the vias.

11. The method, as recited in claim 1, wherein the high aspect ratio features have aspect ratios of at least 20-to-1.

12. The method, as recited in claim 1, wherein providing the secondary electrons to the bottom of the vias reduces twisting that results from asymmetric etching.

13. A method for etching high aspect ratio features in a dielectric layer over a substrate in a plasma processing chamber, comprising:
   placing the substrate in the plasma processing chamber, with an upper electrode and a lower electrode, wherein the substrate is placed over the lower electrode, and wherein the upper electrode is space apart above the lower electrode and the substrate;
   providing an etching gas into the plasma processing chamber;
   forming a plasma in the plasma processing chamber, between the upper electrode and the lower electrode;
   providing a bias to the upper electrode of at least 500 volts to provide secondary electrons with enough energy to pass through a plasma sheath to vias, wherein a positive charge at the bottom of the vias accelerates the secondary electrons to the bottom of the vias;
   providing a pulsed bias of at least 500 volts to the lower electrode for etching the dielectric layer, wherein the providing bias to the upper electrode and providing bias to the lower electrode, comprises switching a bias between the upper electrode and lower electrode, wherein the switch is performed at a frequency between 10 Hz to 100 kHz; and
   wherein the forming a plasma in the plasma processing chamber, between the upper electrode and the lower electrode, comprises providing a high frequency RF with a frequency of over 10 MHz to at least one of the upper electrode or lower electrode.

* * * * *